United States Patent

Langer

(10) Patent No.: US 8,755,759 B2
(45) Date of Patent: *Jun. 17, 2014

(54) DC POWER CONTROL FOR POWER AMPLIFIERS

(71) Applicant: Intel Mobile Communications GmbH, Neubiberg (DE)

(72) Inventor: Andreas Langer, Unterschleissheim (DE)

(73) Assignee: Intel Mobile Communciations GmbH, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/913,659

(22) Filed: Jun. 10, 2013

(65) Prior Publication Data

US 2013/0273979 A1 Oct. 17, 2013

Related U.S. Application Data

(63) Continuation of application No. 12/871,094, filed on Aug. 30, 2010, now Pat. No. 8,463,208.

(51) Int. Cl.
*H01Q 11/12* (2006.01)
*H04B 1/04* (2006.01)

(52) U.S. Cl.
USPC ............... 455/127.1; 455/242.1; 455/550.1; 375/295

(58) Field of Classification Search
USPC ............ 455/127.1, 230, 232.1, 234.1, 240.1, 455/242, 255–260, 323, 334, 550.1; 375/295

See application file for complete search history.

(56) References Cited

U.S. PATENT DOCUMENTS

| | | | |
|---|---|---|---|
| 7,263,135 B2 | 8/2007 | Takabayashi et al. | |
| 8,032,096 B2 | 10/2011 | Rofougaran | |
| 8,050,637 B2 | 11/2011 | Shimizu et al. | |
| 8,463,208 B2 * | 6/2013 | Langer | 455/127.1 |

OTHER PUBLICATIONS

Rumney, Moray; "De-Mystifying Single Carrier FDMA The New LTE Uplink"; Whitepaper, Agilent Technologies, Apr. 2008, p. 1-6.
Office Action dated Sep. 26, 2012 for U.S. Appl. No. 12/871,094.
Notice of Allowance dated Feb. 11, 2013 for U.S. Appl. No. 12/871,094.

* cited by examiner

*Primary Examiner* — Nhan Le
(74) *Attorney, Agent, or Firm* — Eschweiler & Associates, LLC

(57) ABSTRACT

Some embodiments of the present disclosure relate to transmission techniques that result in power savings relative to previous solutions. These techniques often transmit a signal-of-interest by using two paths, namely, a transmission path (which includes a power amplifier) and a control path. The signal-of-interest is evaluated in "fast-track" fashion on the control path, such that the control path can "tune" a DC supply signal provided to the power amplifier. Thus, when a delayed version of the signal-of-interest is provided over the transmission path to the power amplifier, the DC supply signal provided to the power amplifier helps ensure that the power amplifier has "just enough" DC supply to ensure reliable operation without dissipating excess power. In this way, the techniques disclosed herein help to reduce power consumption in transmitters, thereby potentially helping to extend battery life and reduce undesired heating for users.

15 Claims, 4 Drawing Sheets

DC POWER CONTROL FOR POWER AMPLIFIERS

CROSS REFERENCE TO RELATED APPLICATIONS

This application is a Continuation of U.S. patent application Ser. No. 12/871,094 filed on Aug. 30, 2010 entitled "DC Power Control for Power Amplifiers" in the name of Andrea Langer and is hereby incorporated in its entirety.

BACKGROUND

In mobile communication devices, such as mobile phones for example, it is becoming more and more imperative for manufacturers to provide low power solutions. Low power consumption is desirable because it helps to extend the useful battery life of mobile communication devices without a user having to recharge the battery of the device, among other things.

As shown in FIG. 1, a conventional mobile communication device 100 can include a signal generation unit 102 that provides a signal-of-interest, s(t), wherein the signal-of-interest has a low output power that needs to be amplified before transmission. In some examples, the signal generation unit 102 includes a baseband processor, and the signal-of-interest, s(t), represents data to be transmitted by the mobile communication device. For example, the signal-of-interest can represent a person's voice, such as detected by a microphone of the mobile communication device 100 during a phone conversation, and/or other data (e.g., text message, Internet data, music data, image file).

The mobile communication device 100 also includes a radio-frequency (RF) power amplifier 104, which is powered by a DC power supply, such as a DC/DC converter (not shown). The RF power amplifier converts the low-power signal-of-interest into an amplified signal of significant power, typically to drive an antenna 106 of the mobile communication device. Because the power amplifier 104 provides a large gain, the power amplifier 104 outputs a large output signal power based on a small amount of RF input power. The division between the low-power signal generation unit 102 and the power amplifier 104 helps provide a relatively good balance between low power consumption (e.g., facilitated by carrying out signal processing in the signal generation unit 102) and accurate signal transmission (e.g., facilitated by high output power from the power amplifier 104).

Although this basic architecture in FIG. 1 is well-known, the applicants have appreciated that the power amplifier 104 can make a significant contribution to the overall power consumption of the mobile communication device 100. Consequently, in an effort to limit overall power consumption of mobile communication transmitters while still retaining sufficient gain, sufficient modulation accuracy, and sufficient leakage power requirements in adjacent channels; the applicants have devised DC power control techniques for power amplifiers as described herein.

DRAWINGS

DETAILED DESCRIPTION

Figure 1:
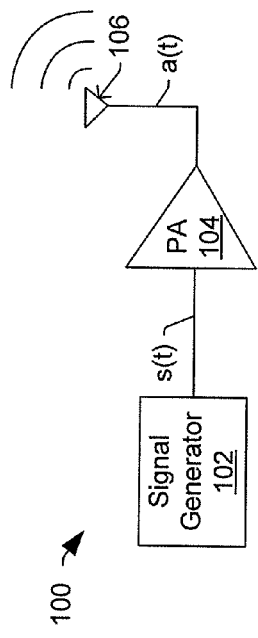
FIG. 1 is a block diagram illustrating a conventional transmitter.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

Some embodiments of the present disclosure relate to transmission techniques that result in power savings relative to previous solutions. These techniques often transmit a signal-of-interest by using two paths, namely, a transmission path and a control path, both of which feed a power amplifier. The signal-of-interest is analyzed in "fast-track" fashion on the control path, such that the control path can "tune" a DC power supply provided to the power amplifier. Thus, when a delayed version of the signal-of-interest is provided over the transmission path to the power amplifier, the DC supply signal provided to the power amplifier helps ensure that the power amplifier has "just enough" DC supply to ensure the transmitted signal meets signal quality requirements for a particular communication protocol (e.g., for the Long Term Evolution (LTE) standard relating to 3GPP 4G technology) without dissipating excess power. In this way, the techniques disclosed herein help to reduce power consumption in transmitters, thereby potentially helping to extend battery life and reduce undesired heating for users.

Figure 2:
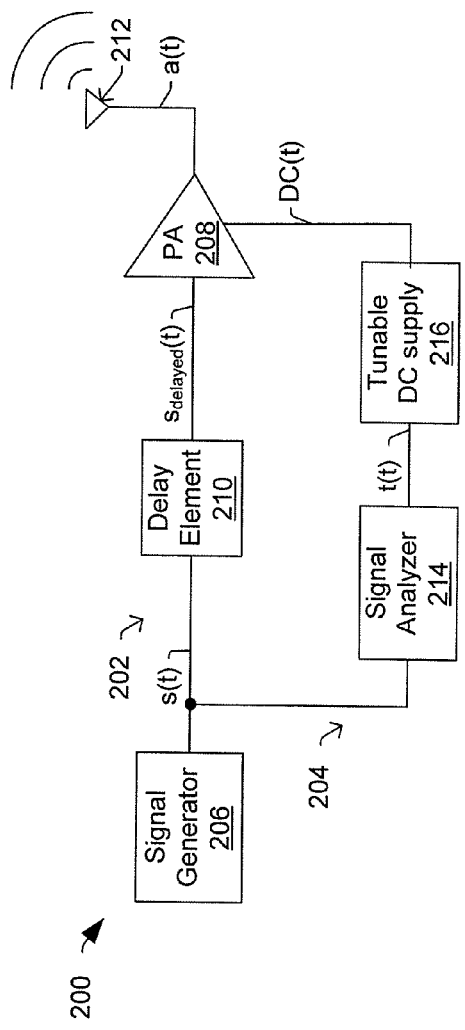
FIG. 2 illustrates a block diagram of a transmitter in accordance with some aspects of this disclosure.

FIG. 2 shows a transmitter 200 in accordance with some embodiments. The transmitter 200 includes a transmission path 202 and a control path 204, both of which are coupled between a signal generator 206 and a power amplifier 208. The transmission path 202 includes a delay element 210; while the control path 204 includes a signal analyzer 214 and a tunable DC supply 216. These elements cooperatively amplify the signal-of-interest for transmission over an RF antenna 212.

During operation, the signal generator 206 provides a signal-of-interest, s(t), which is often a digital bit-stream representing modulated data, such as voice data or other data to be communicated. This signal-of-interest, s(t), is delayed by the delay element 210, which in turn provides a delayed signal-of-interest, $s_{delayed}(t)$ to an input terminal of the power amplifier 208. The delayed signal-of-interest is delayed with respect to the signal-of-interest, but the two signals otherwise have at least substantially corresponding shapes and timing characteristics.

Meanwhile on the control path 204, the signal analyzer 214 analyzes the signal-of-interest, which is time-shifted forward relative to the delayed signal-of-interest delivered to the power amplifier 208. Because of this forward time shifting, the signal analyzer 214 is able to analyze the signal-of-interest, s(t), before the corresponding delayed signal-of-interest, $S_{delayed}(t)$, arrives at the power amplifier 208. Based on the analysis of the signal-of-interest, the signal analyzer 214 then provides a tuning signal, t(t), to the tunable DC power supply 216. The tuning signal, t(t), induces a change in the DC power supply signal, DC(t), such that the DC supply signal accounts for an anticipated change in the amplitude or envelope of the delayed signal-of-interest delivered to the input terminal of the power amplifier 208.

The power amplifier 208, upon receiving both the delayed signal-of-interest, $S_{delayed}(t)$, and the DC power supply DC(t), amplifies the delayed signal-of-interest for transmission over the antenna 212. Because the DC power supplied to the power amplifier 208 is tuned to account for an expected amplitude or envelope of the delayed signal-of-interest, the power amplifier 208 consumes less power on average than previous implementations while still providing reliable signal transmission.

Figure 3:
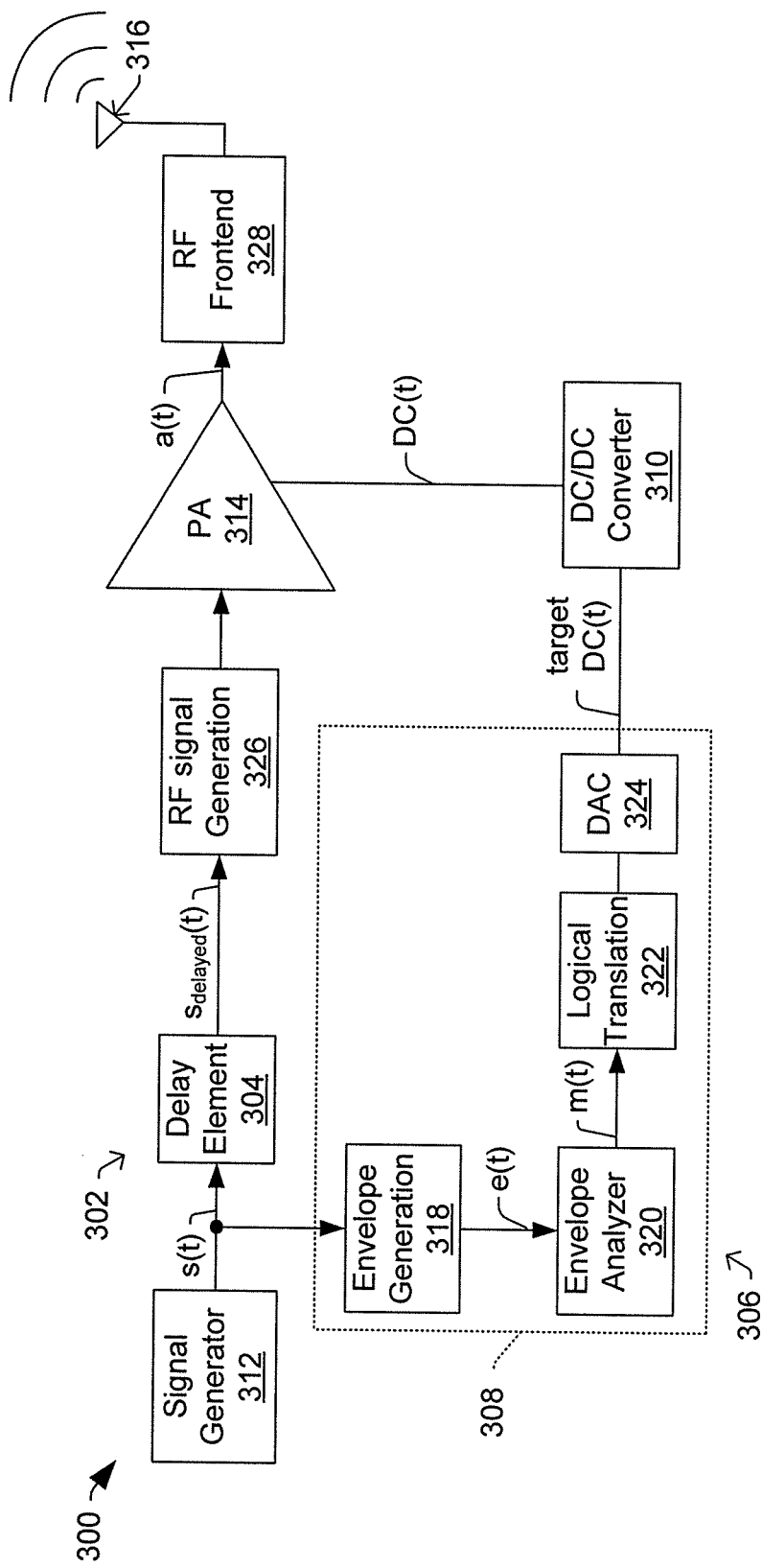
FIG. 3 illustrates a block diagram of another transmitter in accordance with some aspects of this disclosure.

FIG. 3 shows another embodiment of a transmitter 300 in accordance with some embodiments. Like FIG. 2's embodiment, FIG. 3's transmitter 300 includes a transmission path 302 (with delay element 304) and a control path 306 (with signal analyzer 308 and tunable DC supply 310), both of which are coupled between a signal generator 312 and a power amplifier 314 to transmit the signal-of-interest over an antenna 316.

In addition to the previously discussed control path components, the transmitter 300 includes an envelope generation element 318, an envelope analyzer 320, a logical translation block 322, and a digital-to-analog converter (DAC) 324, which are operably coupled as shown. Although FIG. 3 shows a DC/DC converter as one example of a tunable DC power supply 310, other circuits could also be used to achieve this functionality.

In addition to the previously discussed transmission path components, the transmitter 300 also includes RF signal generation element 326 to convert the delayed signal-of-interest from a digital bitstream to an RF analog signal. An RF frontend 328 downstream of the power amplifier 314 is also included.

Figure 4:
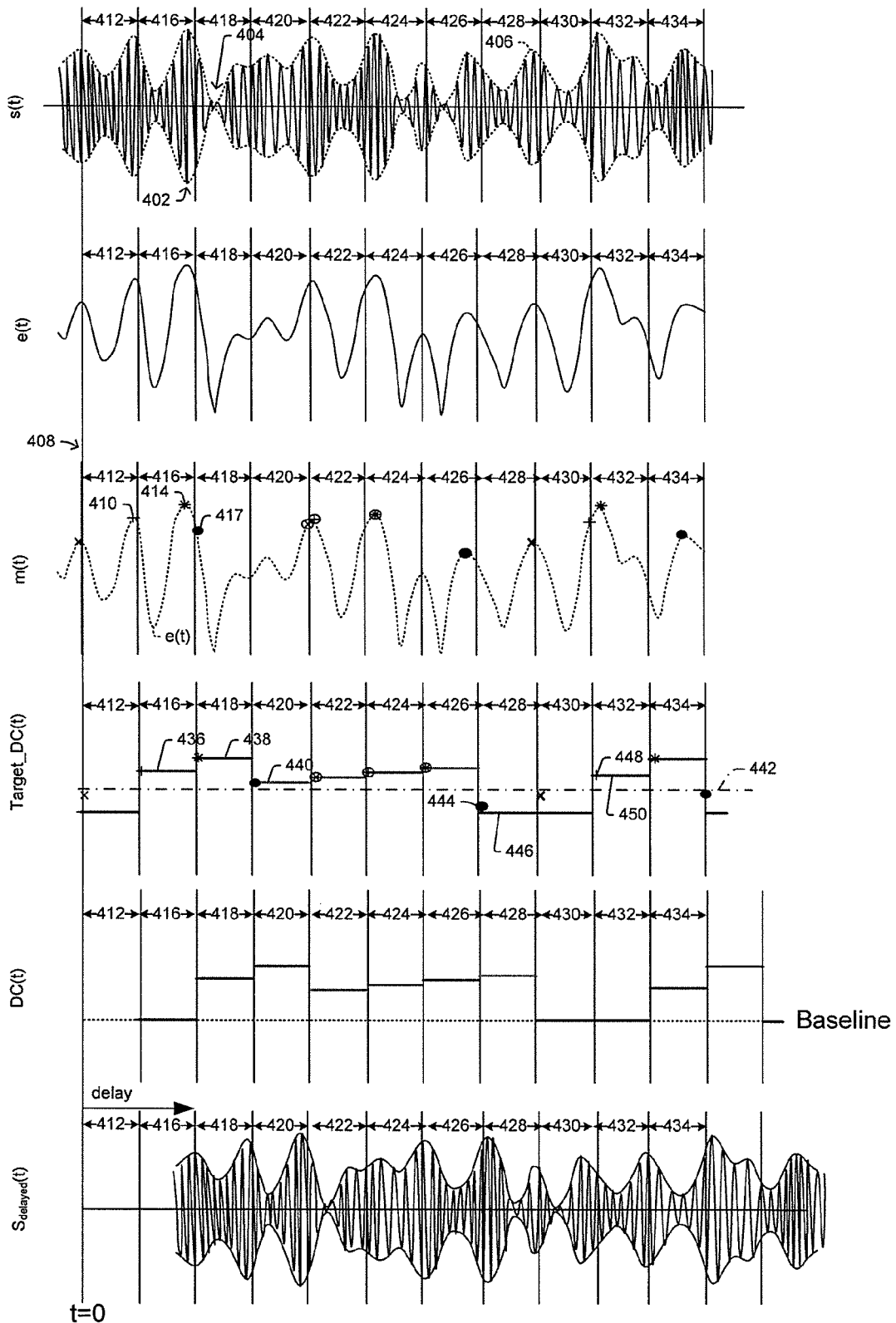
FIG. 4 shows an example of a series of waveforms consistent with one implementation of the transmitter of FIG. 3.

One example of operation consistent with FIG. 3's transmitter 300 is now discussed with reference to the waveforms shown in FIG. 4. Although these waveforms are provided for purposes of clarity, it will be appreciated that actual waveforms can vary significantly from those illustrated, depending on the actual data being transmitted, the communication protocols employed, and the particular hardware on which the techniques are carried out, among other factors.

During operation, the signal generator 312 provides a signal-of-interest, s(t), which is often a digital bitstream representing a modulated signal having a series of peaks (e.g., peak 402) and valleys (e.g., valley 404). The time varying amplitude of the signal gives rise to an envelope 406. The particular shape of the underlying waveform can vary widely, and often represents a user's voice, an FM radio signal, a text message, Internet content, or virtually any type of data to be transmitted via the transmitter 300.

The envelope generator 318 analyzes the signal-of-interest, s(t), and provides an envelope signal, e(t), based thereon, wherein the envelope signal, e(t), is typically a bitstream representing the envelope magnitude or width as a function of time. Thus, when the signal-of-interest, s(t), has a relatively large envelope magnitude or width (e.g., at peak 402), e(t) is relatively large. In contrast, when the signal-of-interest, s(t), has a relatively small envelope magnitude or width (e.g., at valley 404), e(t) is relatively small.

The envelope analyzer 320 analyzes the envelope signal, e(t), over a series of time windows 408 and outputs respective maximum envelope values, m(t), for respective time windows. In FIG. 4's example, the envelope analyzer 320 provides a first maximum envelope value 410 for a first time window 412, a second maximum envelope value 414 for a second time window 416, a third maximum envelope value 417 for a third time window 418, and so on.

The translation logic block 322 receives the maximum envelope values, m(t), and translates each maximum envelope value into a corresponding target DC value for a subsequent time window. For example, the first maximum envelope value 410 is translated into a first target DC value 436, the second maximum envelope value 414 is translated into a second target DC value 438, the third maximum envelope value 417 is translated into a third target DC value 440, and so on. The target DC values can be piecewise continuous, although are not required to be, and can take into account what DC supply voltage is to be used for the delayed signal-of-interest $S_{delay}(t)$ for a given time window. In many embodiments, the translation logic block 322 compares a maximum envelope value to an envelope threshold value 442 to provide a target DC value. For example, in time window 428, the relevant maximum envelope value 444 falls below the envelope threshold value 442, so a baseline target DC value 446 is used during time window 428. By contrast, because the maximum envelope value 448 for time window 432 is above the envelope threshold value 442, the target DC value 450 is scaled for time window 432 depending on the amount by which the maximum envelope value 448 exceeds the envelope threshold value 442.

The DC/DC converter 310, upon receiving the target DC values target_DC(t), outputs a corresponding DC supply signal DC(t). This DC supply signal can be piecewise continuous to reflect the underlying time windows. It will be appreciated however, that the time windows are not required, and that the DC tuning functionality could be achieved using analog circuitry that does not use these time windows. In the illustrated implementation, one can see that the there is a delay between Target_DC(t) and DC(t) due to finite rise time of DC/DC converter 310. Thus, in the illustrated example, the DC/DC converter 310 actually achieves the desired DC(t) value one time window after Target_DC(t) is changed. This delay due to the rise time of the DC/DC converter 310 is at least part of the motivation for including the delay element 304 to generate the delayed signal of interest $S_{delay}(t)$.

Ultimately, the power amplifier 314 receives the DC supply signal DC(t) and the delayed signal-of-interest, $S_{delay}(t)$, in such a manner that the DC supply signal DC(t) for a given time window corresponds to the envelope for the delayed signal-of-interest for the given time window. For example, when the delayed signal-of-interest, $S_{delay}(t)$, has a relatively large envelope throughout a given time window (e.g., during time window 428), the DC supply signal is relatively large for the given time window. In contrast, when the delayed signal-of-interest has a relatively small envelope throughout another given time window (e.g., during time window 430), the DC supply signal is relatively small for the other given time window.

Figure 5:
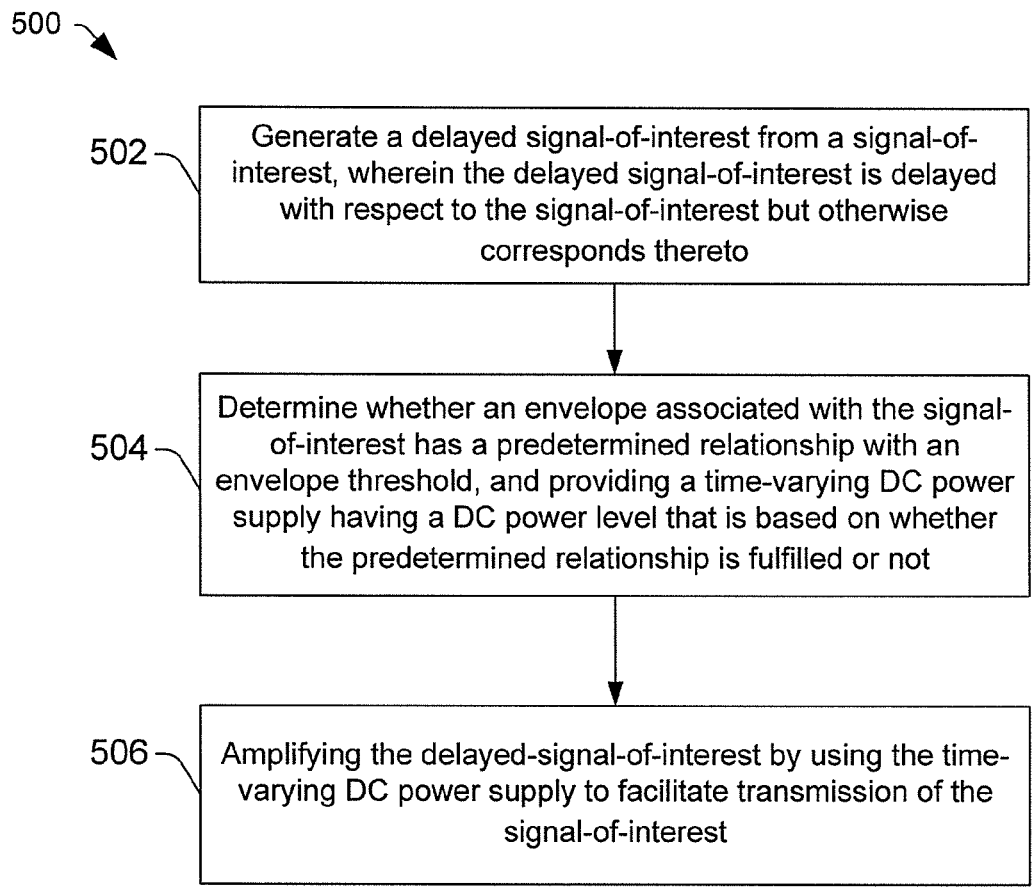
FIG. 5 is a flow chart depicting a method in accordance with some embodiments.

A method in accordance with some embodiments is now described with reference to FIG. 5. While this method is illustrated and described below as a series of acts or events, the present disclosure is not limited by the illustrated ordering of such acts or events. The same is true for other methods disclosed herein. For example, some acts may occur in different orders and/or concurrently with other acts or events apart from those illustrated and/or described herein. In addition, not all illustrated acts are required and any waveform shapes are merely illustrative and other waveforms may vary significantly from those illustrated. Further, one or more of the acts depicted herein may be carried out in one or more separate acts or phases.

FIGS. 1-3 can include suitable hardware and/or software to implement these methods. The method 500 of FIG. 5 begins at 502, by generating a delayed signal-of-interest from a signal-of-interest. The delayed signal-of-interest is delayed with respect to the signal-of-interest but otherwise at least substantially corresponds thereto.

At 504, the method determines whether an envelope associated with the signal-of-interest has a predetermined relationship with an envelope threshold. A time-varying DC power supply, which can for example be piecewise continuous in some embodiments, is provided with a DC power level that is based on whether the predetermined relationship is fulfilled or not.

At 506, the method amplifies the delayed signal-of-interest by using the time-varying DC power supply to facilitate transmission of the signal-of-interest.

Although the disclosure has been shown and described with respect to one or more implementations, equivalent alterations and modifications will occur to others skilled in the art based upon a reading and understanding of this specification and the annexed drawings. For example, although the disclosure has been described above with respect to a mobile communication device, such as a mobile phone in some embodiments, the disclosure is also applicable to other electronics devices. Thus, in other embodiments, envelope tracking techniques can be used in conjunction with power amplifiers that drive a high power source, drive a transmitting antenna, perform microwave heating, and/or which excite resonant cavity structures. The transmitter can be used not only for voice and data communication, but also for weather sensing (e.g., in the form of RADAR), microwave or RF heating, and/or particle accelerators, among other applications.

Further, although some embodiments described above use a piecewise continuous DC power supply, other embodiments can use a fully differentiable DC power supply. A fully differentiable DC power signal varies continuously without any distinct "breaks" in the signal level, and is often realized by analog circuitry. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A communications device, comprising:
  a signal generator configured to provide a signal-of-interest to be amplified via a power amplifier and transmitted over an RF antenna;
  a transmission path extending between the signal generator and the power amplifier and comprising a delay element, wherein the delay element delays the signal-of-interest to provide a delayed signal-of-interest on the transmission path;
  a control path extending between the signal generator and the power amplifier and comprising a signal analyzer and a tunable DC power supply, wherein the signal analyzer is configured to analyze the signal-of-interest by evaluating an envelope thereof and induce a change in a DC power level provided by the tunable DC power supply based thereon; and
  wherein the power amplifier receives the DC power level from the tunable DC power supply and amplifies the delayed-signal-of-interest as a function of the DC power level, thereby facilitating transmission of the signal-of-interest over the RF antenna.

2. The communications device of claim 1, wherein the signal analyzer comprises:
  an envelope generator to determine the envelope of the signal-of-interest; and
  an envelope analyzer to compare a magnitude or width of the envelope of the signal-of-interest at a given time to an envelope threshold value and provide a target DC signal based on the comparison, wherein the target DC signal is used to set the DC power level.

3. The communications device of claim 1, wherein the tunable DC power supply comprises a DC-to-DC converter.

4. The communications device of claim 3, wherein the DC-to-DC converter has a finite rise time and wherein the delay provided by the delay element corresponds to the finite rise time.

5. The communications device of claim 1, wherein the control path further comprises:
  a lookup table to receive an envelope value and output a corresponding target DC signal value based thereon.

6. The communications device of claim 1, wherein the DC power supply provides a piecewise continuous DC power level.

7. The communications device of claim 1, wherein the DC power supply provides a fully differentiable DC power level during normal operation.

8. A transmitter, comprising:
  a transmission path extending between a signal generator and an RF antenna port configured to couple to an RF antenna, wherein the signal generator provides a signal-of-interest on the transmission path;
  a delay element disposed on the transmission path and adapted to delay the signal-of-interest, thereby providing a delayed signal-of-interest;
  a power amplifier disposed on the transmission path and adapted to provide an RF signal to the RF antenna port based on the delayed signal-of-interest;
  a control path to provide a time-varying DC supply signal to the power amplifier based on the signal-of-interest and independent of the RF signal provided by the power amplifier, wherein the DC supply signal at a given time is a function of an amplitude or envelope of the delayed signal-of-interest expected to be encountered by the power amplifier at the given time.

9. The transmitter of claim 8, wherein the control path comprises:
  an envelope generator to determine an envelope of the signal-of-interest; and
  an envelope analyzer to compare a magnitude or width of the envelope of the signal-of-interest at a given time to an envelope threshold value and provide a target DC signal based on the comparison, wherein the target DC signal is used to set the DC supply signal.

10. The transmitter of claim 9, wherein the control path further comprises:

a DC-to-DC converter to provide the DC supply signal based on the target DC signal.

11. The transmitter of claim 10, wherein the DC-to-DC converter has a finite rise time and wherein the delay provided by the delay element corresponds to the finite rise time.

12. The transmitter of claim 9, wherein the control path further comprises:
a lookup table to receive an envelope value and output a corresponding target DC signal value based thereon.

13. The transmitter of claim 8, wherein the time-varying DC supply signal provides a piecewise continuous DC power level.

14. The transmitter of claim 8, wherein the time-varying DC supply signal is fully differentiable during normal operation.

15. A communications device, comprising:
a signal generator configured to provide a signal-of-interest to be amplified via a power amplifier and transmitted over an RF antenna;
a transmission path extending between the signal generator and the power amplifier and comprising a delay element, wherein the delay element delays the signal-of-interest to provide a delayed signal-of-interest on the transmission path;
a control path extending between the signal generator and the power amplifier and comprising a signal analyzer and a tunable DC power supply, wherein the signal analyzer is configured to analyze the signal-of-interest independently of signal output by the power amplifier and is further configured to induce a change in a DC power level provided by the tunable DC power supply based on the analysis of the signal-of-interest; and
wherein the power amplifier receives the DC power level from the tunable DC power supply and amplifies the delayed-signal-of-interest as a function of the DC power level, thereby facilitating transmission of the signal-of-interest over the RF antenna.

* * * * *